United States Patent
Jiang et al.

(10) Patent No.: US 10,794,765 B2
(45) Date of Patent: Oct. 6, 2020

(54) DEVICE FOR SECURING AN INFRARED RADIATION DETECTOR FROM UNWANTED INFRARED RADIATION AND HEAT

(71) Applicant: Wisconsin Alumni Research Foundation, Madison, WI (US)

(72) Inventors: Hongrui Jiang, Madison, WI (US); Seyyed Mohammad J. Moghimi, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 443 days.

(21) Appl. No.: 15/710,185

(22) Filed: Sep. 20, 2017

(65) Prior Publication Data

US 2019/0086261 A1    Mar. 21, 2019

(51) Int. Cl.
| | |
|---|---|
| *G01J 3/02* | (2006.01) |
| *H01L 31/024* | (2014.01) |
| *G01J 5/06* | (2006.01) |
| *H01L 31/0352* | (2006.01) |
| *G01J 5/04* | (2006.01) |
| *H01L 31/0216* | (2014.01) |
| *G01J 5/10* | (2006.01) |
| *G01J 5/08* | (2006.01) |

(52) U.S. Cl.
CPC ............ *G01J 3/0297* (2013.01); *G01J 5/041* (2013.01); *G01J 5/046* (2013.01); *G01J 5/06* (2013.01); *G01J 5/061* (2013.01); *G01J 5/10* (2013.01); *H01L 31/024* (2013.01); *H01L 31/02162* (2013.01); *H01L 31/035227* (2013.01); *G01J 5/0806* (2013.01); *G01J 2005/065* (2013.01); *G01J 2005/106* (2013.01)

(58) Field of Classification Search
CPC .................................. G01J 3/0297; G01J 5/06
USPC ........................................................ 250/352
See application file for complete search history.

(56) References Cited

U.S. PATENT DOCUMENTS

| | | | |
|---|---|---|---|
| 6,690,014 B1 | 2/2004 | Gooch et al. | |
| 2007/0190368 A1 | 8/2007 | Jung et al. | |
| 2008/0152901 A1* | 6/2008 | Ting ...................... | B82Y 20/00 428/328 |
| 2009/0321645 A1* | 12/2009 | Hinnrichs ............. | G01J 3/2803 250/338.5 |
| 2012/0154196 A1 | 6/2012 | Cincotti et al. | |
| 2012/0185109 A1 | 7/2012 | Olson et al. | |

(Continued)

*Primary Examiner* — David P Porta
*Assistant Examiner* — Abra S Fein
(74) *Attorney, Agent, or Firm* — Boyle Fredrickson, S.C.

(57) ABSTRACT

A device is provided for securing a plurality of infrared radiation detectors from unwanted infrared radiation. The device includes a structure supporting the plurality of infrared radiation detectors. A plurality of nanowires are positioned adjacent to each other so as to define a layer. The layer has an inner surface positioned adjacent an outer surface of the structure and an outer surface directable towards a source of unwanted infrared radiation. The plurality of IR radiation detectors are aligned with a desired field of view so as to receive IR radiation radiating from any objects in the field of view such that a first portion of the IR radiation engages and is absorbed by IR radiation detectors, while a second portion of the IR radiation engages and is absorbed by IR radiation detector is absorbed by layer.

31 Claims, 4 Drawing Sheets

(56) References Cited

U.S. PATENT DOCUMENTS

2012/0298190 A1* 11/2012 Dutta ................ H01L 31/03529
  136/253
2014/0111364 A1   4/2014 Sjolund
2014/0247478 A1   9/2014 Bates et al.
2018/0230523 A1*  8/2018 Vo-Dinh ................ B82Y 20/00

* cited by examiner

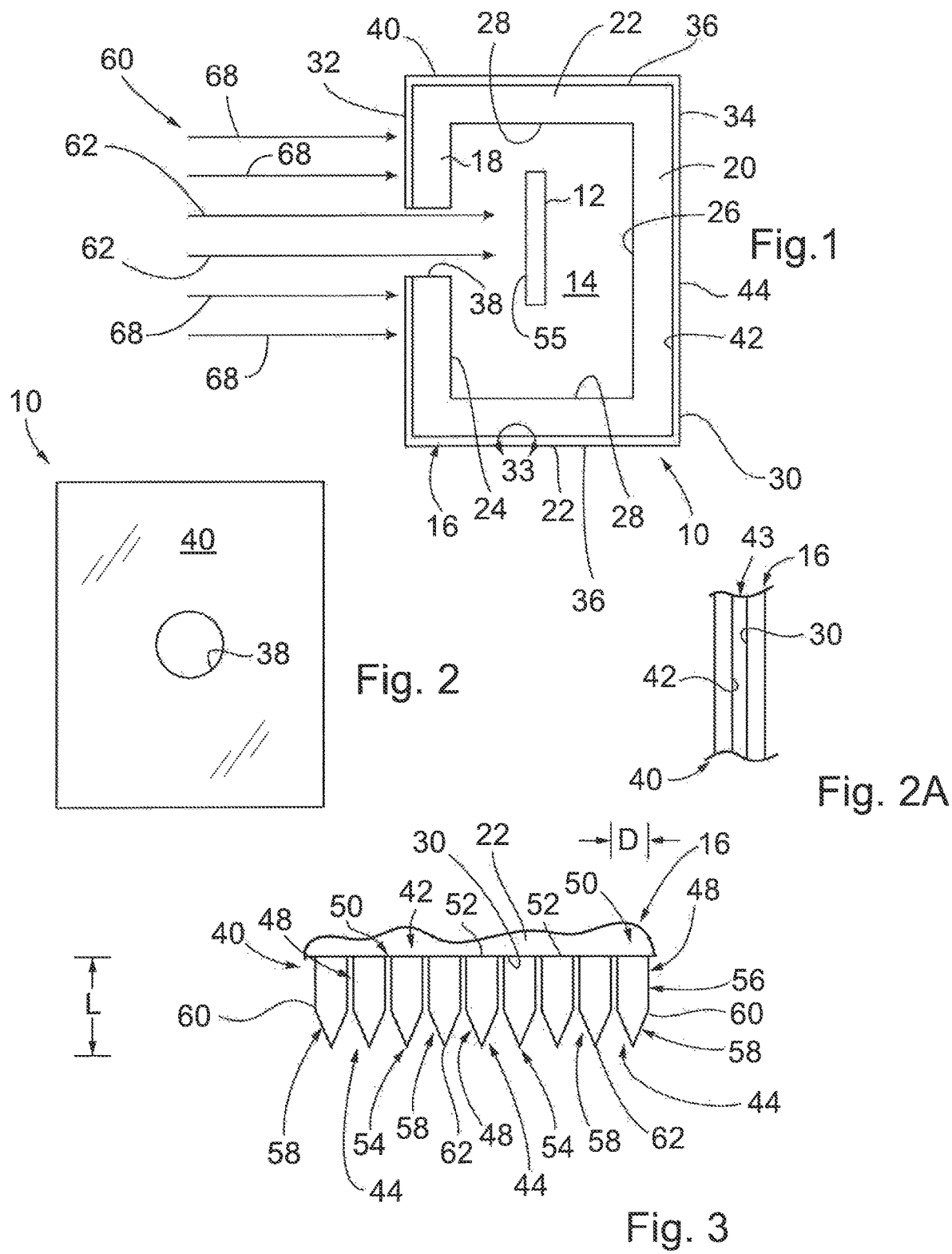

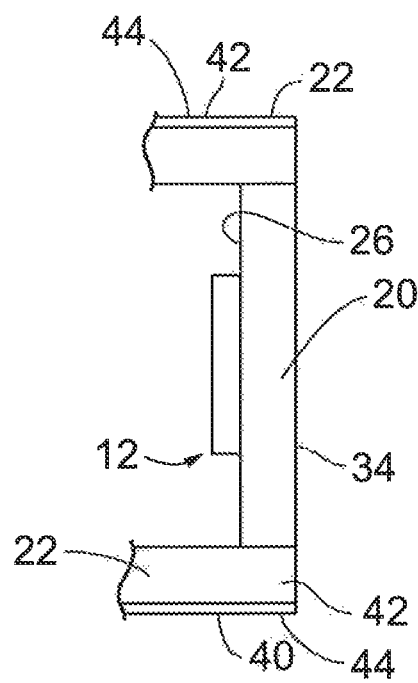
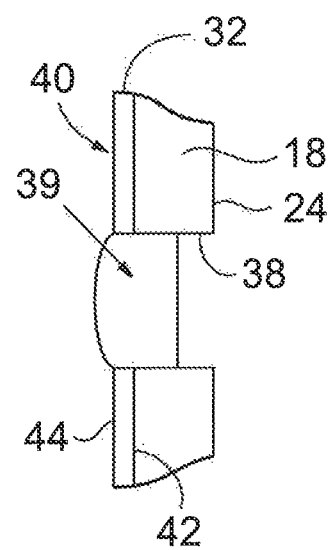
Fig. 4      Fig. 5
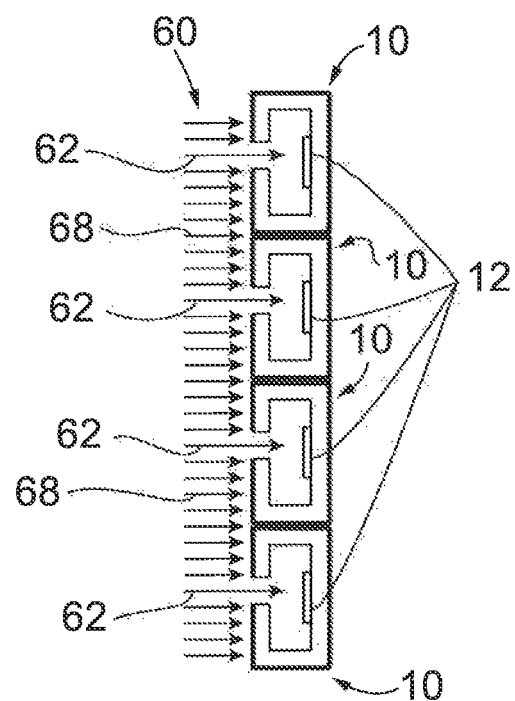
Fig. 6

DEVICE FOR SECURING AN INFRARED RADIATION DETECTOR FROM UNWANTED INFRARED RADIATION AND HEAT

FIELD OF THE INVENTION

This invention relates generally to infrared (IR) radiation detection, and in particular, to a device for securing an infrared radiation detector from unwanted infrared radiation and heat.

BACKGROUND AND SUMMARY OF THE INVENTION

An infrared radiation detector is an electronic instrument which is used to sense the infrared radiation radiating from objects in the field of view of the detector. There are two types of detectors used for infrared detection, namely, cryogenically cooled sensors and room temperature sensors. Cryogenically cooled sensors require very low temperature to operate and are required to be in contact with coolant materials, such as liquid nitrogen and helium. The cooling mechanisms of these cryogenically cooled sensors are cumbersome, rendering the associated detectors slow and unsuitable for use in field. Moreover, the absorption bandwidth of the semiconductor materials used in cryogenically cooled sensors is limited, and hence, the cryogenically cooled sensors can only detect a specific spectral band. For wide band applications, multiple sensors are needed to sense various regions of the spectrum.

In contrast to cryogenically cooled sensors, room temperature sensors operate at ambient temperatures. Heretofore, the dominant technology for room-temperature sensing is micro-bolometers. Micro-bolometers include a detector material that absorbs infrared radiation within a range of specific wavelengths. The infrared radiation heats the detector material, thereby changing the electrical resistance of the detector material. The change in electrical resistance of the detector material creates a corresponding current or voltage signal that can be used to create an image.

Typically, these prior infrared radiation detectors include a plurality of individual detectors. Shields, having openings therein to allow infrared radiation to impinge on the infrared radiation detectors, extend about the outer peripheries of the individual detectors. The shields are intended to prevent "unwanted" radiation from reaching the materials of the individual detectors. It can be appreciated that engagement of the detector materials of the individual detectors by "unwanted" radiation can adversely affect the electro-optical performance of the system. More specifically, in order to insure the proper the performance of infrared cameras and detectors, it is highly desirable of the shields to absorb over 90% of unwanted infrared radiation.

Therefore, it is a primary object and feature of the present invention to provide a device for securing an infrared radiation detector from unwanted infrared radiation and heat.

It is a further object and feature of the present invention to provide a device for securing an infrared radiation detector from unwanted infrared radiation over a wide spectral band.

It is a still further object and feature of the present invention to provide a device for securing an infrared radiation detector from unwanted infrared radiation and heat that is simple to utilize and inexpensive to manufacture.

In accordance with the present invention, a device is provided for securing an infrared radiation detector from unwanted infrared radiation. The device includes a housing defining a cavity therein configured for receiving the infrared radiation detector therein. The housing has an outer surface and a forward wall with an aperture extending through. A plurality of nanowires are positioned adjacent to each other so as to define a layer. The layer has an inner surface positioned adjacent the outer surface of the housing and an outer surface directable towards a source of unwanted infrared radiation.

The housing includes a rear wall. The rear wall is configured to support the infrared radiation detector thereon. Each nanowire of the plurality of nanowires is fabricated from silicon impregnated with silver nanoparticles. Each nanowire of the plurality of nanowires includes a terminal first end partially defining the inner surface of the layer and a second end. The second end of each nanowire of the plurality of nanowires has a generally conical configuration and terminates at a tip. The tip at the second end of each nanowire of the plurality of nanowires partially defines the outer surface of the layer.

In accordance with a further aspect of present invention, a device is provided for securing a plurality of infrared radiation detectors from unwanted infrared radiation. The device includes a structure supporting the plurality of infrared radiation detectors. The structure includes an outer surface. A plurality of nanowires is positioned adjacent to each other so as to define a layer. The layer has an inner surface positioned adjacent to the outer surface of the structure and an outer surface directable towards a source of unwanted infrared radiation.

In a first embodiment, the structure includes a plurality of housings. Each housing defines a cavity therein configured for receiving a corresponding detector therein; and has an outer surface and a forward wall with an aperture extending therethrough. The outer surfaces of the housings define the outer surface of the structure. The layer surrounds the apertures in the forward walls of the housings. The housing includes a rear wall. The rear wall is configured to support the infrared radiation detector thereon. Each nanowire of the plurality of nanowires is fabricated from silicon impregnated with silver nanoparticles. Each nanowire of the plurality of nanowires includes a terminal first end partially defining the inner surface of the layer and a second end. The second end of each nanowire of the plurality of nanowires has a generally conical configuration and terminates at a tip. The tip at the second end of each nanowire of the plurality of nanowires partially defines the outer surface of the layer.

In an alternate embodiment, the structure may include a substrate supporting the plurality of infrared radiation detectors in spaced relation thereon. The layer surrounds each of the plurality of infrared radiation detectors supported on the substrate.

In accordance with a still further aspect of the present invention, a device is provided for securing a plurality of infrared radiation detectors from unwanted infrared radiation. The device includes a structure supporting the plurality of infrared radiation detectors. A plurality of nanowires are positioned adjacent to each other so as to define a layer. The layer has an inner surface positioned adjacent to the structure and an outer surface directable towards a source of IR radiation.

In a first embodiment, the structure includes a plurality of housings. Each housing defines a cavity therein configured for receiving a corresponding detector therein; and has an outer surface and a forward wall with an aperture extending therethrough. The layer surrounds the apertures in the forward walls of the housings. Each housing includes a rear wall. The rear wall is configured to support the infrared radiation detector thereon. Each nanowire of the plurality of nanowires is fabricated from silicon impregnated with silver nanoparticles. Each nanowire of the plurality of nanowires includes a terminal first end partially defining the inner surface of the layer and a second end. The second end of each nanowire of the plurality of nanowires has a generally conical configuration and terminates at a tip. The tip at the second end of each nanowire of the plurality of nanowires partially defines the outer surface of the layer.

In an alternate embodiment, the structure includes a substrate supporting the plurality of infrared radiation detectors in spaced relation thereon. The layer surrounds each of the plurality of infrared radiation detectors supported on the substrate.

BRIEF DESCRIPTION OF THE DRAWINGS

The drawings furnished herewith illustrate a preferred construction of the present invention in which the above aspects, advantages and features are clearly disclosed as well as others which will be readily understood from the following description of the illustrated embodiments.
In the drawings:

FIG. 1 is a schematic, cross-sectional view of a device for securing an infrared radiation detector from unwanted infrared radiation in accordance with the present invention;

FIG. 2 is a schematic, front elevational view of the device of FIG. 1;

FIG. 2A is an enlarged, schematic view showing an alternate arrangement for the device of FIG. 1;

FIG. 3 is an enlarged schematic view of the device of the present invention taken along line 3-3 of FIG. 1;

FIG. 4 is an enlarged schematic view showing a first alternate construction of the device of FIG. 1;

FIG. 5 is an enlarged schematic view showing a second alternate construction of the device of FIG. 1;

FIG. 6 is a schematic, cross-sectional view showing a plurality of devices of FIG. 1 arranged in a side-by-side relationship;

DETAILED DESCRIPTION OF THE DRAWINGS

Figure 7:
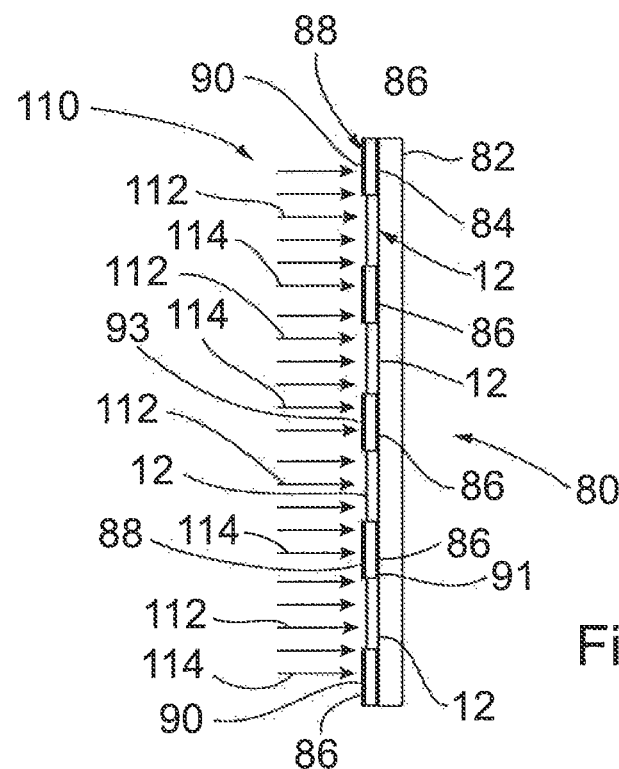
FIG. 7 is a schematic, cross-sectional view of an alternate embodiment of a device for securing an infrared radiation detector from unwanted infrared radiation in accordance with the present invention.

Referring to FIGS. 1-2, a device for securing an infrared (IR) radiation detector 12 from unwanted infrared radiation and heat is generally designated by the reference numeral 10. As is conventional, IR radiation detector 12 detects the differences in thermal radiance of various objects in a scene. That difference is converted into an electrical signal which is subsequently processed by an evaluation circuit (not shown) which converts the signals outputted by IR radiation detector 12 to an image corresponding to the thermal radiance sensed by IR radiation detector 12. It can be appreciated that the evaluation circuit, the image display and electrical connections between IR radiation detector 12 and the evaluation circuit are not necessary for a complete understanding of the present invention, and as such, these elements are not depicted in the drawing figures.

Device 10 includes housing 16 having cavity 14 formed therein. It is intended for IR radiation detector 12 to be supported in cavity 14 within the interior of housing 16. Housing 16 has a generally box-like configuration defined by forward wall 18 spaced from and interconnected to rear wall 20 by a plurality of sidewalls 22. It is contemplated for housing 16 to be fabricated from a low-emissivity substrate, such as metal. Alternatively, rear wall 20 may be fabricated from a printed circuit board or a monolithic circuit, FIG. 4, without deviating from the scope of the present invention. In such an arrangement, IR radiation detector 12 may be mounted directly to inner surface 26 of rear wall 20.

Referring back to FIG. 1, inner surface 24 of forward wall 18, inner surface 26 of rear wall 20 and inner surfaces 28 of the plurality of sidewalls 22 define cavity 14. Outer surface 30 of housing 16 is defined by outer surface 32 of forward wall 18, outer surface 34 of rear wall 20 and outer surfaces 36 of the plurality of sidewalls 22. Aperture 38 extends through forward wall 18 between inner and outer surfaces 24 and 32, respectively. Aperture 38 is axially aligned with IR radiation detector 12 in cavity 14 of housing 16 and defines a field of view through which IR radiation may pass and be detected by IR radiation detector 12. It is contemplated to position lens 39 within aperture 38 so as to direct IR radiation passing through aperture 38 (and hence, lens 39) toward IR radiation detector 12, FIG. 5.

Absorption layer 40 is fabricated from an IR absorptive material and has an inner surface 42 affixed to outer surface 30 of housing 16 and an outer surface 44.

Alternatively, a thermal insulation layer, generally designated by the reference numeral 43, may be positioned between inner surface 42 of absorption layer 40 and outer surface 44 of housing 16, FIG. 2A, to supplement absorption layer 40 in preventing unwanted heat and IR radiation from penetrating housing 16 and impinging on IR radiation detector 12 therein.

By way of example, absorption layer 40 is constructed from a plurality nanowires 48 fabricated from silicon (SiNWs) impregnated with silver nanoparticles (AgNPs) and positioned adjacent each other, FIG. 3. Alternatively, nanowires 48 may be fabricated from simply silicon (SiNWs) or other materials, without deviating from the scope of the present invention. In order for absorption layer 40 to maximize absorption over a wide range of wavelengths ranging from visible to IR radiations, it is contemplated for each silicon nanowire to have a length L in the range of 1 to 50 micrometers (μm), and preferably, in the range of 4 to 20 μm and a diameter in the range of 2 nanometers (nm) to 2 μm, and preferably, in the range of 20 to 400 nm. The silver nanoparticles have dimensions smaller than 200 nm.

Each nanowire 48 has a first end 50 terminating at a generally flat end surface 52 and a second end 54. End surfaces 52 of the plurality of nanowires 48 define inner surface 42 of layer 40. It is contemplated for inner surface 42 of absorption layer 40 (in other words, end surfaces 52 of nanowires 48) to be bonded to outer surface 30 of housing 16 in any conventional manner, such as by an adhesive. A generally cylindrical portion 56 of each nanowires 48 projects from end surface 52 and is interconnected to a generally conical portion 58 at intersection 60. Conical portion 58 of each nanowire 48 terminates at tip 62 at second end 54 thereof. Tips 52 of conical portions 58 of the plurality of nanowires 48 define outer surface 44 of absorption layer 40. It is noted that while the depicted embodiment shows nanowires 48 with generally conical portions 58 at is second ends 54 thereof, other configurations are possible without deviating from the scope of the present invention. For example, absorption layer 40 may be affixed to outer surface 30 of housing 16 such that tips 52 of nanowires 48 define inner surface 42 and end surfaces 52 of nanowires 48 define outer surface 44. In addition, it is further contemplated for the portion of each nanowire 48 adjacent second end 54 to be engineered with an alternate configuration (e.g. cylinder, steeple-like, etc.) to facilitate IR absorption.

In operation, IR detection sensor 12 is positioned such that detecting surface 55 of the detector material of IR radiation detector 12 is aligned with a desired field of view so as to receive IR radiation 60 radiating from any objects in the field of view. It can be appreciated that a first portion 62 of IR radiation 60 passes through aperture 38 of forward wall 18 of housing 16 and is absorbed by IR radiation detector 12. As is conventional, IR radiation detector 12 generates an electrical signal corresponding to the IR radiation absorbed which is subsequently processed by an evaluation circuit (not shown) which converts the signals outputted by IR radiation detector 12 to an image.

Second portion 68 of IR radiation 60 engages outer surface 44 of absorption layer 40 and is absorbed. More specifically, second portion 68 of IR radiation 60 becomes trapped between the SiNWs and the AgNPs of the plurality of nanowires 48 and is converted into thermal energy. It has been found that nanowires 48 absorb incident IR radiation on absorption layer 40 at an efficiency of over 98%. By absorbing second portion 68 of IR radiation 60, absorption layer 40 significantly reduces the amount of unwanted heat and stray IR radiation on IR radiation detector 12. It has been found that absorption layer 40 fabricated with nanowires 48, as heretofore described, is effective for IR radiation having wavelengths in the range of 2.5 to 16.6 μm (4000 to 600 centimeters (cm)−1).

As best seen in FIG. 6, it is contemplated for device 10 to be one of a plurality of devices 10. Housings 16 of devices 10 may be positioned in a side-by-side relationship such that IR radiation detectors 12 of devices 10 are axially directed toward various objects in a scene. In such an arrangement, IR radiation detectors 12 of devices 10 correspond to an array to pixels which may be used to define an image corresponding to the thermal radiance emanating from the various objects in the scene.

Figure 8:
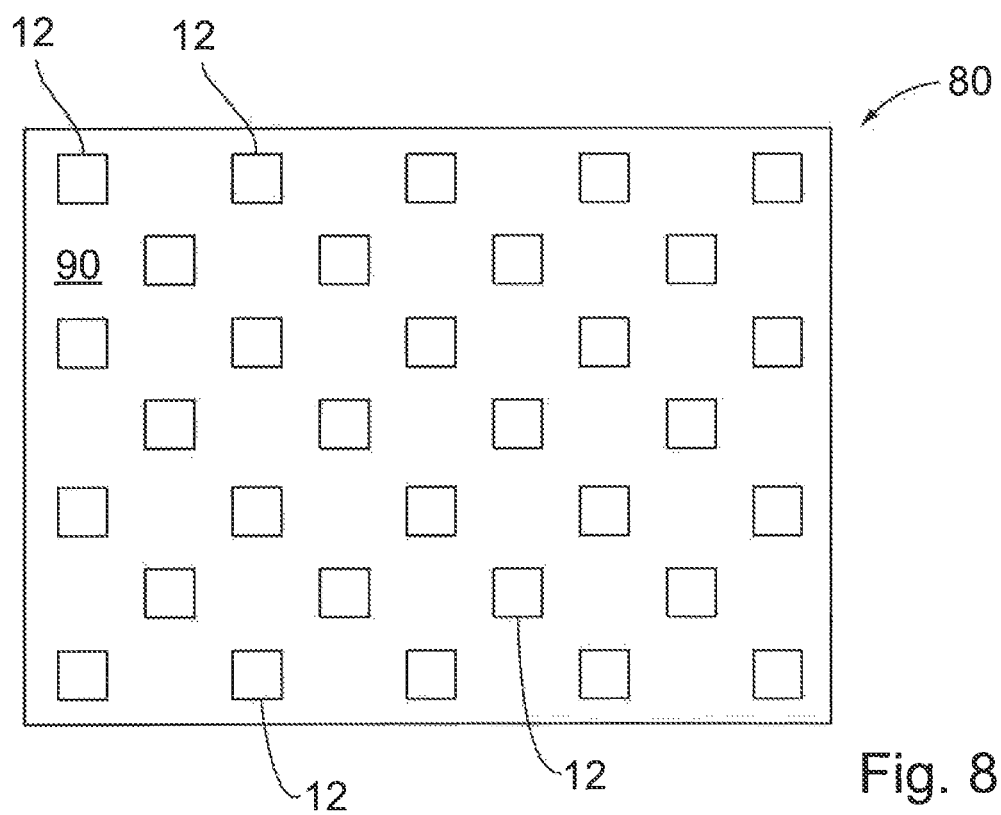
FIG. 8 is a schematic, front elevational view of the device of FIG. 7.

Referring to FIGS. 7-8, an alternate embodiment of a device for securing a plurality of infrared (IR) radiation detectors 12 from unwanted infrared radiation and heat is generally designated by the reference numeral 80. In the depicted embodiment, a plurality of IR radiation detectors 12 are spaced along and supported on outer surface 84 of substrate 82, e.g., in a checkerboard-like pattern, FIG. 8. Substrate 82 may be fabricated from any suitable substrate material, such as a monolithic circuit, a printed circuit board or the like. While it is contemplated for substrate 82 to have a generally rectangular configuration, other configurations are possible without deviating from the scope of the present invention.

Insulation layer 86 is deposited on outer surface 84 of substrate 82 so as to surround the plurality of IR radiation detectors 12 spaced along and supported on outer surface 84 of substrate 82. Insulation layer 86 is fabricated from an electrical insulating material and includes an outer surface 88. It is intended for outer surface 88 of insulation layer 86 to receive absorption layer 90 thereon so as to electrically insulate absorption layer 90 from substrate 82. It is intended for absorption layer 90 to surround each of the plurality of infrared (IR) radiation detectors 12.

Figure 9:
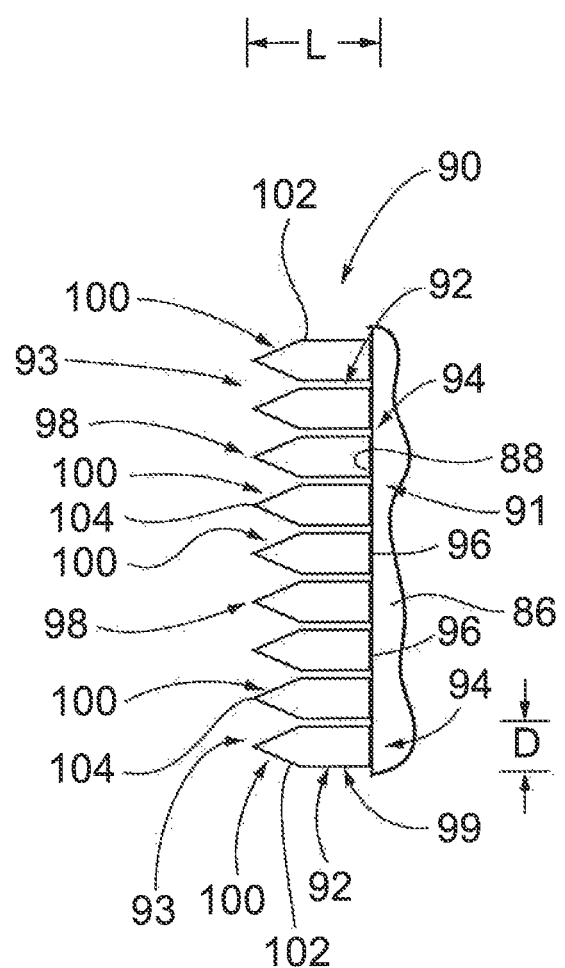
FIG. 9 is an enlarged schematic view of the device of the present invention taken along line 9-9 of FIG. 7.

Absorption layer 90 is fabricated from an infrared absorptive material defined by inner and outer surfaces 91 and 93, respectively. By way of example, absorption layer 90 is constructed from a plurality nanowires 92 fabricated from silicon (SiNWs) impregnated with silver nanoparticles (Ag-NPs) and positioned adjacent each other, FIG. 9. Alternatively, nanowires 92 may be fabricated from simply silicon (SiNWs) or other materials, without deviating from the scope of the present invention. In order for absorption layer 90 to maximize absorption over a wide range of wavelengths ranging from visible to infrared radiations, it is contemplated for each silicon nanowire to have a length L in the range of 1 to 50 micrometers (μm), and preferably, in the range of 4 to 20 μm and a diameter in the range of 2 nanometers (nm) to 2 μm, and preferably, in the range of 20 to 400 nm. The silver nanoparticles have dimensions smaller than 200 nm.

Each nanowire 92 has a first end 94 terminating at a generally flat end surface 96 and a second end 98. End surfaces 96 of the plurality of nanowires 92 define inner surface 91 of absorption layer 90. It is contemplated for inner surface 91 of absorption layer 90 (in other words, end surfaces 96 of nanowires 92) to be bonded to outer surface 88 of insulation layer 86 in any conventional manner, such as by an adhesive. A generally cylindrical portion 99 of each nanowires 92 projects from end surface 96 and is interconnected to a generally conical portion 100 at intersection 102. Conical portion 100 of each nanowire 92 terminates at tip 104 at second end 98 thereof. Tips 104 of conical portions 100 of the plurality of nanowires 92 define outer surface 93 of absorption layer 90. It is noted that while the depicted embodiment shows nanowires 92 with generally conical portions 100 at second ends 98 thereof, other configurations are possible without deviating from the scope of the present invention. For example, absorption layer 90 may be affixed to outer surface 88 of insulation layer 86 such that tips 104 of nanowires 92 define inner surface 91 and end surfaces 96 of nanowires 92 define outer surface 93. In addition, it is further contemplated for the portion of each nanowire 92 adjacent second end 98 to be engineered with an alternate configuration (e.g. cylinder, steeple-like, etc.) to facilitate IR absorption.

In operation, the plurality of JR radiation detectors 12 are directed towards and aligned with a desired field of view so as to receive IR radiation 110 radiating from any objects in the field of view. It can be appreciated that a first portion 112 of IR radiation 110 passes absorption layer 90 and is absorbed by JR radiation detector 12. As is conventional, IR radiation detectors 12 generate electrical signals corresponding to the IR radiation absorbed by each individual IR radiation detector 12 which is subsequently processed by an evaluation circuit (not shown) and converted to an image.

Second portion 114 of IR radiation 110 engages outer surface 93 of absorption layer 90 and is absorbed. More specifically, second portion 114 of IR radiation 110 becomes trapped between the SiNWs and the AgNPs of the plurality of nanowires 92 and is converted into thermal energy. It has been found that the density of nanowires 92 absorb incident IR radiation on absorption layer 90 at an efficiency of over 98%. By absorbing second portion 114 of IR radiation 110, absorption layer 90 significantly reduces the amount of unwanted heat and stray IR radiation on IR radiation detectors 12. It has been found that absorption layer 90 fabricated with nanowires 90, as heretofore described, is effective for IR radiation having wavelengths in the range of 2.5 to 16.6 μm (4000 to 600 centimeters (cm)−1).

It can be appreciated that the above descriptions of the device and method are merely exemplary of the present invention. Various modes of carrying out the invention are contemplated as being within the scope of the following claims particularly pointing out and distinctly claiming the subject matter, which is regarded as the invention.

We claim:

1. A device for securing an infrared radiation detector from unwanted infrared radiation, comprising:
   a housing defining a cavity therein configured for receiving the infrared radiation detector therein, the housing having an outer surface and a forward wall with an aperture extending through; and
   a plurality of nanowires positioned adjacent to each other so as to define a layer, the layer having an inner surface positioned adjacent the outer surface of the housing and an outer surface directable towards a source of unwanted infrared radiation;
wherein each nanowire of the plurality of nanowires extends along a corresponding axis generally perpendicular to the outer surface of the housing.

2. The device of claim 1 wherein the housing includes a rear wall, the rear wall configured to support the infrared radiation detector thereon.

3. The device of claim 1 wherein each nanowire of the plurality of nanowires is fabricated from silicon impregnated with silver nanoparticles.

4. The device of claim 1 wherein the housing is fabricated from a low-emissivity substrate.

5. The device of claim 4 wherein the low-emissivity substrate is metal.

6. The device of claim 1 further comprising a thermal insulator positioned between an inner surface of the layer and the outer surface of the housing.

7. A device for securing an infrared radiation detector from unwanted infrared radiation, comprising:
   a housing defining a cavity therein configured for receiving the infrared radiation detector therein, the housing having an outer surface and a forward wall with an aperture extending through; and
   a plurality of nanowires positioned adjacent to each other so as to define a layer, the layer having an inner surface positioned adjacent the outer surface of the housing and an outer surface directable towards a source of unwanted infrared radiation;
wherein each nanowire of the plurality of nanowires includes a terminal first end partially defining the inner surface of the layer and a second end.

8. The device of claim 7 wherein the second end of each nanowire of the plurality of nanowires has a generally conical configuration and terminates at a tip.

9. The device of claim 8 wherein the tip at the second end of each nanowire of the plurality of nanowires partially defines the outer surface of the layer.

10. A device for securing a plurality of infrared radiation detectors from unwanted infrared radiation, comprising:
    a structure supporting the plurality of infrared radiation detectors, the structure including an outer surface; and
    a plurality of nanowires positioned adjacent to each other so as to define a layer, the layer having an inner surface positioned adjacent the outer surface of the structure and an outer surface directable towards a source of unwanted infrared radiation;
wherein each nanowire of the plurality of nanowires extends along a corresponding axis generally perpendicular to the outer surface of the structure.

11. The device of claim 10 wherein the structure includes a plurality of housings, each housing:
    defining a cavity therein configured for receiving a corresponding detector therein; and
    having an outer surface and a forward wall with an aperture extending therethrough;
wherein the outer surfaces of the housings define the outer surface of the structure.

12. The device of claim 11 wherein the housing includes a rear wall, the rear wall configured to support the infrared radiation detector thereon.

13. The device of claim 10 wherein each nanowire of the plurality of nanowires is fabricated from silicon impregnated with silver nanoparticles.

14. The device of claim 10 further comprising a thermal insulator positioned between the inner surface of the layer and the outer surface of the housing.

15. The device of claim 10 wherein the structure includes a substrate supporting the plurality of infrared radiation detectors in spaced relation thereon.

16. A device for securing a plurality of infrared radiation detectors from unwanted infrared radiation, comprising:
    a structure supporting the plurality of infrared radiation detectors, the structure including an outer surface; and
    a plurality of nanowires positioned adjacent to each other so as to define a layer, the layer having an inner surface positioned adjacent the outer surface of the structure and an outer surface directable towards a source of unwanted infrared radiation;
wherein:
    the structure includes a plurality of housings, each housing:
        defining a cavity therein configured for receiving a corresponding detector therein; and
        having an outer surface and a forward wall with an aperture extending therethrough;
    the outer surfaces of the housings define the outer surface of the structure; and
    the layer surrounds the apertures in the forward walls of the housings.

17. A device for securing a plurality of infrared radiation detectors from unwanted infrared radiation, comprising:
    a structure supporting the plurality of infrared radiation detectors, the structure including an outer surface; and
    a plurality of nanowires positioned adjacent to each other so as to define a layer, the layer having an inner surface positioned adjacent the outer surface of the structure and an outer surface directable towards a source of unwanted infrared radiation;
wherein each nanowire of the plurality of nanowires includes a terminal first end partially defining the inner surface of the layer and a second end.

18. The device of claim 17 wherein the second end of each nanowire of the plurality of nanowires has a generally conical configuration and terminates at a tip.

19. The device of claim 18 wherein the tip at the second end of each nanowire of the plurality of nanowires partially defines the outer surface of the layer.

20. A device for securing a plurality of infrared radiation detectors from unwanted infrared radiation, comprising:
    a structure supporting the plurality of infrared radiation detectors, the structure including an outer surface; and
    a plurality of nanowires positioned adjacent to each other so as to define a layer, the layer having an inner surface positioned adjacent the outer surface of the structure and an outer surface directable towards a source of unwanted infrared radiation;
wherein:
    the structure includes a substrate supporting the plurality of infrared radiation detectors in spaced relation thereon; and the layer surrounds each of the plurality of infrared radiation detectors supported on the substrate.

21. A device for securing a plurality of infrared radiation detectors from unwanted infrared radiation, comprising:
   a structure supporting the plurality of infrared radiation detectors; and
   a plurality of nanowires positioned adjacent to each other so as to define a layer, the layer having an inner surface positioned adjacent the structure and an outer surface directable towards a source of IR radiation;
wherein each nanowire of the plurality of nanowires extends along a corresponding axis generally perpendicular to an outer surface of the structure.

22. The device of claim 21 wherein the structure includes a plurality of housings, each housing:
   defining a cavity therein configured for receiving a corresponding detector therein; and
   having an outer surface and a forward wall with an aperture extending therethrough.

23. The device of claim 22 wherein each housing includes a rear wall, the rear wall configured to support the infrared radiation detector thereon.

24. The device of claim 21 wherein each nanowire of the plurality of nanowires is fabricated from silicon impregnated with silver nanoparticles.

25. The device of claim 21 further comprising a thermal insulator positioned between the inner surface of the layer and an outer surface of the structure.

26. The device of claim 21 wherein the structure includes a substrate supporting the plurality of infrared radiation detectors in spaced relation thereon.

27. A device for securing a plurality of infrared radiation detectors from unwanted infrared radiation, comprising:
   a structure supporting the plurality of infrared radiation detectors; and
   a plurality of nanowires positioned adjacent to each other so as to define a layer, the layer having an inner surface positioned adjacent the structure and an outer surface directable towards a source of IR radiation;
wherein:
   the structure includes a plurality of housings, each housing:
      defining a cavity therein configured for receiving a corresponding detector therein; and
      having an outer surface and a forward wall with an aperture extending therethrough; and
   the layer surrounds the apertures in the forward walls of the housings.

28. A device for securing a plurality of infrared radiation detectors from unwanted infrared radiation, comprising:
   a structure supporting the plurality of infrared radiation detectors; and
   a plurality of nanowires positioned adjacent to each other so as to define a layer, the layer having an inner surface positioned adjacent the structure and an outer surface directable towards a source of IR radiation;
wherein each nanowire of the plurality of nanowires includes a terminal first end partially defining the inner surface of the layer and a second end.

29. The device of claim 28 wherein the second end of each nanowire of the plurality of nanowires has a generally conical configuration and terminates at a tip.

30. The device of claim 29 wherein the tip at the second end of each nanowire of the plurality of nanowires partially defines the outer surface of the layer.

31. A device for securing a plurality of infrared radiation detectors from unwanted infrared radiation, comprising:
   a structure supporting the plurality of infrared radiation detectors; and
   a plurality of nanowires positioned adjacent to each other so as to define a layer, the layer having an inner surface positioned adjacent the structure and an outer surface directable towards a source of IR radiation;
wherein:
   the structure includes a substrate supporting the plurality of infrared radiation detectors in spaced relation thereon; and
   the layer surrounds each of the plurality of infrared radiation detectors supported on the substrate.

* * * * *